United States Patent
Zhang et al.

(10) Patent No.: US 11,271,021 B2
(45) Date of Patent: Mar. 8, 2022

(54) FABRICATION METHOD OF ARRAY SUBSTRATE WITH GREATER ADHESION BETWEEN CONDUCTIVE LAYER AND CONNECTION MEMBER

(71) Applicant: TCL CHINA STAR OPTOELECTRONICS TECHNOLOGY CO., LTD., Guangdong (CN)

(72) Inventors: Xin Zhang, Guangdong (CN); Xiaobo Hu, Guangdong (CN)

(73) Assignee: TCL China Star Optoelectronics Technology Co., Ltd., Guangdong (CN)

( * ) Notice: Subject to any disclaimer, the term of this patent is extended or adjusted under 35 U.S.C. 154(b) by 0 days.

(21) Appl. No.: 16/954,575

(22) PCT Filed: May 12, 2020

(86) PCT No.: PCT/CN2020/089736
§ 371 (c)(1),
(2) Date: Jun. 17, 2020

(87) PCT Pub. No.: WO2021/217718
PCT Pub. Date: Nov. 4, 2021

(65) Prior Publication Data
US 2021/0335830 A1 Oct. 28, 2021

(30) Foreign Application Priority Data
Apr. 28, 2020 (CN) .......................... 202010350393.4

(51) Int. Cl.
*H01L 33/00* (2010.01)
*H01L 33/62* (2010.01)
(Continued)

(52) U.S. Cl.
CPC ........ *H01L 27/124* (2013.01); *H01L 25/0753* (2013.01); *H01L 33/005* (2013.01); *H01L 33/62* (2013.01); *H01L 2933/0066* (2013.01)

(58) Field of Classification Search
CPC . H01L 27/124; H01L 25/0753; H01L 33/005; H01L 33/62
See application file for complete search history.

(56) References Cited

U.S. PATENT DOCUMENTS

2002/0070382 A1* 6/2002 Yamazaki ........... G02F 1/13458
257/72
2003/0112382 A1* 6/2003 Takahashi ......... H01L 29/66765
349/43
(Continued)

*Primary Examiner* — Allen L Parker
*Assistant Examiner* — Gustavo G Ramallo
(74) *Attorney, Agent, or Firm* — Mark M. Friedman

(57) ABSTRACT

An array substrate, a fabrication method thereof, and a display device are provided. The fabrication method includes forming a first conductive layer and a second conductive layer on both of a first area and a second area of a substrate; forming a bonding pin in the first area to electrically connect with a driving chip, wherein the second conductive layer is located at a side of the first conductive layer away from the substrate; and removing the second conductive layer in the second area, forming a conductive electrode in the second area to electrically connect with a light-emitting element by a connection member.

8 Claims, 5 Drawing Sheets forming a first conductive layer and a second conductive layer on both of a first area and a second area of a substrate and a bonding pin in the first area to electrically connect with a driving chip, wherein the second conductive layer is located at a side of the first conductive layer away from the substrate, and the first area and the second area are spaced apart — S101 removing the second conductive layer in the second area, forming a conductive electrode in the second area to electrically connect with a light-emitting element by a connection member, wherein adhesion between the first conductive layer and the connection member is greater than adhesion between the second conductive layer and the connection member, and the second conductive layer is used to prevent oxidation of the first conductive layer — S102

(51) Int. Cl.
*H01L 27/12* (2006.01)
*H01L 25/075* (2006.01)

(56) References Cited

U.S. PATENT DOCUMENTS

2008/0188042 A1* 8/2008 Lee .................. H01L 27/124
 438/158
2013/0193464 A1* 8/2013 Bae .................. H01L 33/62
 257/94

* cited by examiner

FABRICATION METHOD OF ARRAY SUBSTRATE WITH GREATER ADHESION BETWEEN CONDUCTIVE LAYER AND CONNECTION MEMBER

FIELD OF INVENTION

The present application relates to a field of display technology, and more particularly to an array substrate, a fabrication method thereof, and a display device.

BACKGROUND

FIG. 1 is a schematic diagram of a conventional mini light-emitting diode (mini-LED) backlight module. The conventional mini-LED backlight module comprises a first metal pattern layer formed on a substrate 100, wherein the first metal pattern layer comprises a first conductive member 1011 and a gate electrode 1012; a gate insulating layer 102 covering the first metal pattern layer and a gate electrode of the substrate 100; an active layer 103 formed on the gate insulating layer 102; a second metal pattern layer formed at a side of the active layer 103 away from the substrate 100, wherein the second metal pattern layer comprises a second conductive member 1041, source and drain electrodes, and a conductive electrode 1042, wherein the second conductive member 1041 is electrically connected to the first conductive member 1011; a passivation layer 105 covering the second metal pattern layer and the gate insulating layer 102, and exposing the conductive electrode 1042; an indium tin oxide layer 106 formed on the passivation layer 105 which electrically connects with the second conductive member 1041 through a via hole formed in the passivation layer 105; and a mini-LED 107. Herein, the second metal pattern layer comprises a copper layer, and the indium tin oxide layer 106 is used to prevent the copper layer of the second conductive member 1041 from being oxidized. However, the conventional mini-LED backlight module has a problem of numerous manufacturing processes.

In order to simplify the manufacturing process of the conventional mini-LED backlight module, conventional technology uses the second metal pattern layer to simultaneously form a conductive structure bound to a flip-chip film and a conductive electrode bound to the mini-LED, with the second metal pattern layer comprising a copper layer and a MoTiNi alloy layer on the copper layer. The MoTiNi alloy layer is away from the substrate, and the copper layer is close to the substrate. The MoTiNi alloy layer is used to prevent oxidation of the copper layer, omitting formation of the indium tin oxide layer, thereby simplifying the manufacturing process. However, in the conductive electrode in the second metal pattern layer, since the MoTiNi alloy layer and the solder paste do not easily form a solid solution alloy, adhesion of the solder paste on the MoTiNi alloy layer is poor, resulting in the mini-LED not being able to be firmly bonded to the conductive electrode using the solder paste.

Therefore, it is necessary to propose a technical solution to solve the problems such as weak bonding of the mini-LED and the conductive structure used to bind the flip-chip film is easily oxidized while the outermost layer thereof uses copper resulted from the poor adhesion of the MoTiNi alloy layer and the solder paste.

SUMMARY

A purpose of the present application is to provide an array substrate, a fabrication method thereof, and a display device.

The fabrication method has a simplified manufacturing process, which increases oxidation resistances of the bonding pin and adhesion between a connection member and a conductive electrode, thereby having an advantage of making a light-emitting element being firmly fixed on the array substrate.

To achieve the above object, the present invention provides a fabrication method of an array substrate, comprising following steps:

forming a first conductive layer and a second conductive layer on both of a first area and a second area of a substrate and a bonding pin in the first area to electrically connect with a driving chip, wherein the second conductive layer is located at a side of the first conductive layer away from the substrate, and the first area and the second area are spaced apart; and removing the second conductive layer in the second area, forming a conductive electrode in the second area to electrically connect with a light-emitting element by a connection member;

wherein adhesion between the first conductive layer and the connection member is greater than adhesion between the second conductive layer and the connection member, and the second conductive layer is used to prevent oxidation of the first conductive layer.

In the above fabrication method, before removing the second conductive layer in the second area, the fabrication method further comprises a following step:

forming an insulating layer covering the second conductive layer of the first area and the second area;

after removing the second conductive layer in the second area, the fabrication method further comprises:

using a first etching gas to etch the insulating layer in the first area, exposing the bonding pin, wherein the first etching gas etches the insulating layer at a rate greater than a rate of the first etching gas etching the first conductive layer.

In the above fabrication method, the first etching gas comprises $NF_3$.

In the above fabrication method, the first etching gas further comprises an inert gas.

In the above fabrication method, the first etching gas is a mixture of $NF_3$ and He.

In the above fabrication method, a material for forming the first conductive layer is selected from Cu or Cu alloy, and a material for forming the second conductive layer is selected from Mo or Mo alloy, and a material for forming the connection member is selected from tin or tin alloy.

In the above fabrication method, a material for forming the second conductive layer is MoTiNi alloy.

In the above fabrication method, removing the second conductive layer in the second area comprises:

etching the second conductive layer in the second area by using a second etching gas comprising $BCl_3$.

In the above fabrication method, the second etching gas further comprises $Cl_2$.

An array substrate comprises:

a substrate comprising a first area and a second area, wherein the first area and the second area are spaced apart;

a bonding pin in the first area of the substrate to electrically connect with a driving chip, wherein the binding pin comprises a first conductive layer and a second conductive layer, and the second conductive layer is located at a side of the first conductive layer away from the substrate; and a conductive electrode in the second area to electrically connect with a light-emitting element by a connection member, wherein the conductive electrode comprises the first conductive layer;

wherein, adhesion between the first conductive layer and the connection member is greater than adhesion between the second conductive layer and the connection member, and the second conductive layer is used to prevent oxidation of the first conductive layer.

In the above array substrate, a material for forming the first conductive layer is selected from Cu or Cu alloy, and a material for forming the second conductive layer is selected from Mo or Mo alloy, and a material for forming the connection member is selected from tin or tin alloy.

In the above array substrate, a material for forming the second conductive layer is MoTiNi alloy or MoNbTa alloy.

In the above array substrate, the bonding pin and the conductive electrode both comprises a third conductive layer, and the first conductive layer is located between the second conductive layer and the third conductive layer.

In the above array substrate, the third conductive layer is a MoTiNi alloy layer.

A display device, wherein the display device comprises an array substrate, and the array substrate comprises:

a substrate comprising a first area and a second area, wherein the first area and the second area are spaced apart;

a bonding pin in the first area of the substrate to electrically connect with a driving chip, wherein the binding pin comprises a first conductive layer and a second conductive layer, and the second conductive layer is located at a side of the first conductive layer away from the substrate; and a conductive electrode in the second area to electrically connect with a light-emitting element by a connection member, wherein the conductive electrode comprises the first conductive layer;

wherein, adhesion between the first conductive layer and the connection member is greater than adhesion between the second conductive layer and the connection member, and the second conductive layer is used to prevent oxidation of the first conductive layer.

In the above display device, a material for forming the first conductive layer is selected from Cu or Cu alloy, and a material for forming the second conductive layer is selected from Mo or Mo alloy, and a material for forming the connection member is selected from tin or tin alloy.

In the above display device, a material for forming the second conductive layer is MoTiNi alloy or MoNbTa alloy.

In the above display device, the bonding pin and the conductive electrode both comprises a third conductive layer, and the first conductive layer is located between the second conductive layer and the third conductive layer.

In the above display device, the third conductive layer is a MoTiNi alloy layer.

The present application provides an array substrate, a fabrication method thereof, and a display device. The fabrication method comprises forming a first conductive layer and a second conductive layer on both of a first area and a second area of a substrate and a bonding pin in the first area to electrically connect with a driving chip, wherein the second conductive layer is located at a side of the first conductive layer away from the substrate, and the first area and the second area are spaced apart; and removing the second conductive layer in the second region, forming a conductive electrode in the second area to electrically connect with a light-emitting element by a connection member; wherein adhesion between the first conductive layer and the connection member is greater than adhesion between the second conductive layer and the connection member, and the second conductive layer is used to prevent oxidation of the first conductive layer. When compared with the bonding pin and the conductive electrode are obtained by patterning two different conductive layers of the conventional technology, the bonding pin and the conductive electrode of the present application are obtained by patterning the first conductive layer and second conductive layer which are stacked. The fabrication method further simplifies manufacturing processes, and the second conductive layer of the bonding pin plays a role of preventing oxidation of the first conductive layer and improves oxidation resistances of the bonding pin. The first conductive layer of the conductive electrode and the connecting member have good adhesion and adhesion between the connector and the conductive electrode is improved, thereby firmly fixing the light emitting element on the array substrate.

100, 200 substrate; 1011 first conductive member; 2011, 1012 gate; 102 gate insulating layer; 103 active layer; 1041 second conductive member; 1042, 2047 conductive electrode; 105 passivation layer; 106 indium tin oxide layer; 107 mini light-emitting diodes; 200a first region; 200b second area; 200c third area; 202 first insulating layer; 203 amorphous silicon layer; 2041 first conductive layer; 2042 second conductive layer; 2043 third conductive layer; 2044 bonding pin; 2045 source electrode; 2046 drain electrode; 205 second insulating layer; 206 patterned photoresist layer; 207 solder paste; 208 light emitting element; 209 flip chip.

DETAILED DESCRIPTION

The technical solutions in the embodiments of the present application will be described clearly and completely with reference to the drawings in the embodiments of the present application. Obviously, the described embodiments are only a part of the embodiments of the present application, but not all the embodiments. Based on the embodiments in the present application, all other embodiments obtained by those skilled in the art without making creative work fall within the protection scope of the present application.

Figure 1:
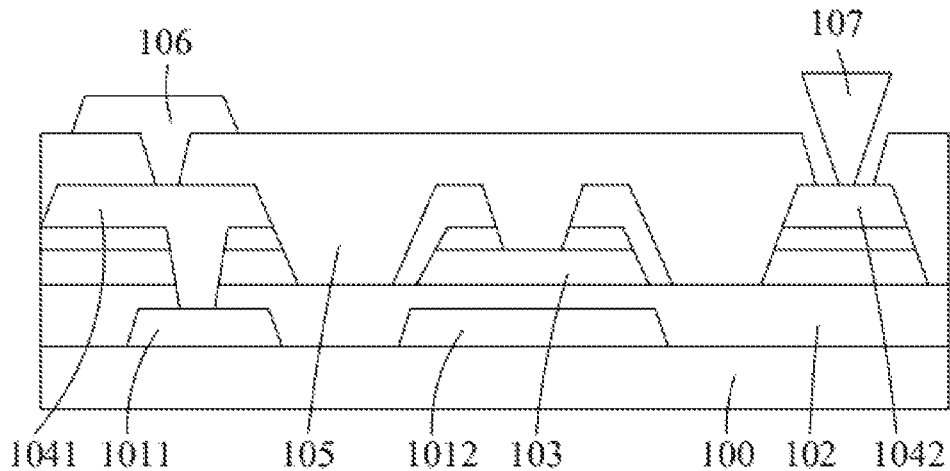
FIG. 1 is a schematic diagram of a conventional sub-millimeter light-emitting diode (LED) backlight module.
Figure 2:
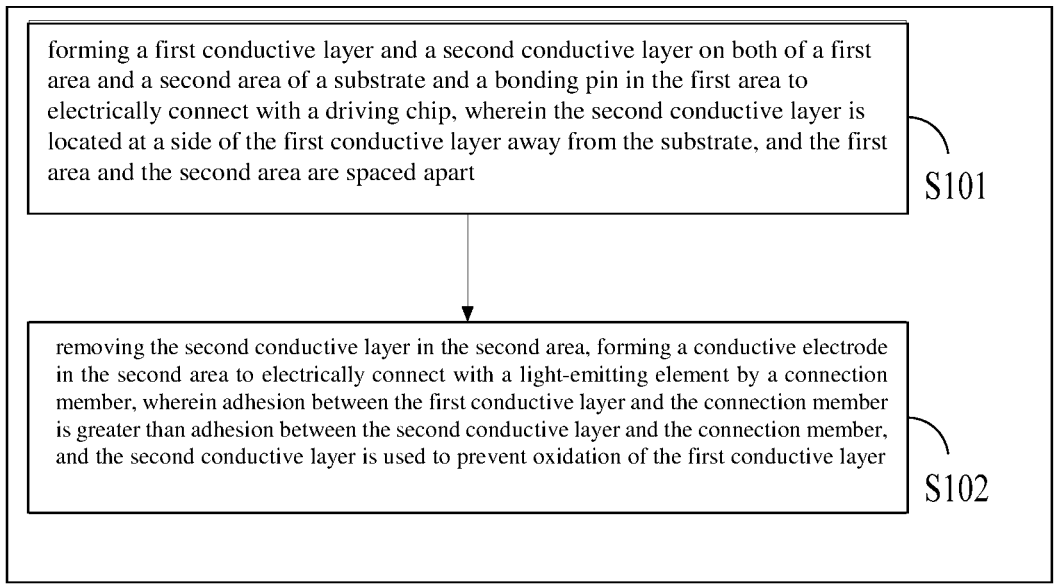
FIG. 2 is a flowchart of a fabrication method of an array substrate according to an embodiment of the present application.

Please refer to FIG. 2, which is a flowchart of a fabrication method of an array substrate according to an embodiment of the present application. The fabrication method of an array substrate comprises following steps:

Step S101: forming a first conductive layer and a second conductive layer on both of a first and a second area of a substrate, and forming a bonding pin in the first area to electrically connect with a driving chip, wherein the second conductive layer is located at a side of the first conductive layer away from the substrate, and the first area and the second area are spaced apart.

Step S102: removing the second conductive layer in the second area, forming a conductive electrode in the second area to electrically connect with a light-emitting element by a connection member, wherein adhesion between the first conductive layer and the connection member is greater than adhesion between the second conductive layer and the connection member, and the second conductive layer is used to prevent oxidation of the first conductive layer.

In some embodiments, before removing the second conductive layer in the second area, the fabrication method further comprises following steps:

forming an insulating layer covering the second conductive layer of the first area and the second area;

after removing the second conductive layer in the second area, the fabrication method further comprises:

using a first etching gas to etch the insulating layer in the first area and exposing the bonding pin, wherein the first etching gas etches the insulating layer at a faster rate than the first etching gas etches the first conductive layer.

Since the first conductive layer is also exposed to the first etching gas when the insulating layer in the first area is etched, an etching rate of the first etching gas on the insulating layer is controlled to be faster than an etching rate on the first conductive layer to increase an etching selectivity ratio of the first etching gas between the first conductive layer and the insulating layer, thereby avoiding unnecessary etching of the first conductive layer during the etching of the insulating layer.

In some embodiments, the first etching gas comprises $NF_3$. Compared with conventional etching gas used for insulating layers (silicon nitride layer and/or silicon oxide layer), mixtures such as $SF_6$, $Cl_2$, and etc. will corrode the first conductive layer when comprised of copper or a copper alloy; comparatively, $NF_3$ is unreactive with and protects copper, preventing the first conductive layer from being oxidized during an etching of the insulating layer using thereof. The first etching gas may further comprise an inert gas, the inert gas being used as a carrier gas and can be such as He, Ar, and other inert gases to control the morphology of a groove or opening formed when etching the insulating layer. Specifically, the first etching gas is a mixture of $NF_3$ and He.

In some embodiments, a material for forming the first conductive layer is selected from Cu or a Cu alloy, which is beneficial to improve the conductivity of the bonding pin and the conductive electrode, and Cu and Sn pastes can form a solid solution alloy with good adhesion therebetween, which is beneficial to firmly bond a light-emitting element (such as a mini light-emitting diode (mini-LED) and a micro light-emitting diode (micro-LED)) to the conductive electrode. Among them, copper alloys comprise copper-molybdenum alloys, copper-silver alloys, copper-titanium alloys, and the like. Specifically, the first conductive layer is made of copper.

In some embodiments, a material for forming the second conductive layer is selected from Mo or a Mo alloy, which can prevent the first conductive layer from oxidizing while also blocking diffusion of the first conductive layer. In particular, when the material for forming the second conductive layer is a MoTiNi alloy or a MoNbTa alloy, oxidation resistance of the second conductive layer is better than that of Mo, etc., and thereby avoiding oxidation of the bonding pins. However, it is difficult for Mo and the Mo alloys to form solid solution alloys with tin, resulting in poor adhesion between Mo and the Mo alloys with tin.

In some embodiments, a material for forming the connection member is selected from tin or a tin alloy, by disposing a solder paste on the conductive electrode and disposing the light-emitting element on the solder paste, so that the light-emitting element is bound to the conductive electrode.

In some embodiments, removing the second conductive layer in the second area comprises etching the second conductive layer in the second area by using a second etching gas comprising $BCl_3$. When the second conductive layer is the MoTiNi alloy, the inventors found through extensive experiments that because the MoTiNi alloy has a better oxidation resistance and corrosion resistance than traditional Mo and the like, the MoTiNi alloy is difficult to etch, and traditional etching gases such as $SF_6$, $NF_3$, $CF_4$ and other etching gases cannot etch the MoTiNi alloy. After a lot of experimental exploration, it was found that $BCl_3$ can etch the MoTiNi alloy. The second etching gas may also comprise a promoting gas, such as $Cl_2$, to promote etching.

The fabrication method of the above array substrate will be described in detail below in conjunction with specific embodiments.

A fabrication method of an array substrate, the fabrication method comprises following steps:

Step S201: forming a first metal pattern layer on a substrate.

The substrate is a glass substrate. The substrate 200 is defined with a first area 200a, a second area 200b, and a third area 200c. The third area 200c is located between the first area 200a and the second area 200b. The first area 200a and the third area 200c are spaced apart, and the third area 200c and the second area 200b are spaced apart, and the first area 200a and the second area 200b are spaced apart, wherein the term "spaced apart" means an existence of an interval area. The first area 200a is used to dispose a bonding pin 2044, and the bonding pin 2044 and the flip chip are connected by an anisotropic conductive adhesive, or the bonding pin 2044 and the driving chip are connected by an anisotropic conductive adhesive. The second area 200b is used to dispose a conductive electrode 2047 and a light-emitting element (LED) 208, and the conductive electrode 2047 and the light-emitting element 208 are connected by a connection member. The bonding pin 2044 is electrically insulated from the conductive electrode 2047. The third area 200c is used to dispose a thin film transistor, which is used to drive the light-emitting element 208 and control a light-emitting state of the light-emitting element 208. The thin film transistor comprises a gate 2011, a gate insulating layer, an active layer, and source/drain electrodes.

Figure 3A:
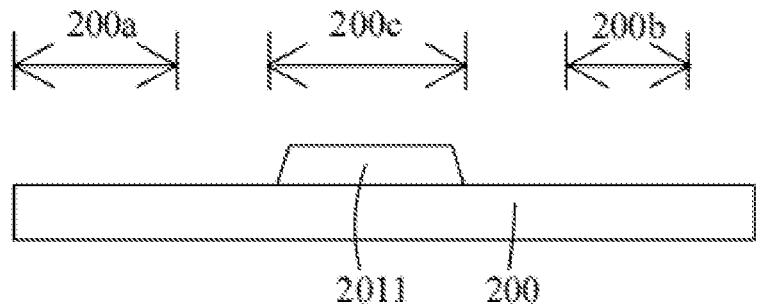
FIG. 3A-3H are schematic diagrams of processes of a fabrication method of an array substrate of an embodiment of the present application.

Specifically, a first metal layer is formed on the entire surface of the substrate 200, and a photoresist layer is formed on the entire surface of the first metal layer. A first metal pattern layer is obtained after performing a mask exposure process and a developer developing process, etching the first metal not covered by the photoresist layer, and removing the residual photoresist layer, as shown in FIG. 3A.

Herein, the first metal pattern layer comprises the gate electrode 2011 disposed in the third area 200c, and may further comprise a first conductive member (not shown) disposed in the first area 200a. The first conductive member electrically connects with the bonding pin through a via in a subsequently formed first insulating layer 202. The first metal layer comprises a molybdenum layer and a copper layer stacked on the substrate 200 in sequence. A thickness of the molybdenum layer is about 300 angstroms to 500 angstroms, and a thickness of the copper layer is about 4000 angstroms to 6000 angstroms.

Step S202: forming a first insulating layer 202 covering the substrate 200 and the first metal pattern layer.

Figure 3B:
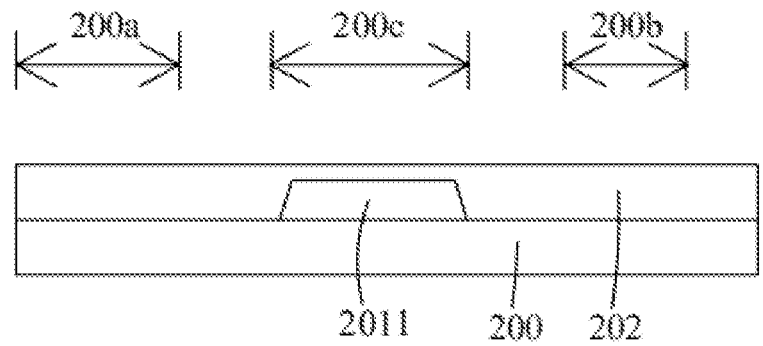

Specifically, a chemical vapor deposition is used to form the first insulating layer 202 covering the gate electrode 2011, the first conductive member, and the substrate 200, as shown in FIG. 3B.

The first insulating layer 202 is a gate insulating layer. The first insulating layer 202 is made of silicon nitride or/and silicon oxide. A thickness of the first insulating layer 202 is 800 angstroms to 6000 angstroms.

Step S203: forming a semiconductor layer and a second metal layer on the first insulating layer 202 in sequence, forming a bonding pin in the first area 200a using a patterning process, and forming an active layer and source/drain electrodes in the third area 200c, and forming a second conductive layer and a first conductive layer in the second area 200b.

Specifically, an amorphous silicon layer 203 with an entire surface is sequentially formed on the first insulating layer 202, and then a second metal layer with an entire surface is formed on a surface of the amorphous silicon layer 203 away from the substrate 200. The second metal layer comprises a first conductive layer 2041, a second conductive layer 2042, and a third conductive layer 2043. The first conductive layer 2041 is disposed between the second conductive layer 2042 and the third conductive layer 2043, and the third conductive layer 2043 is disposed near the substrate 200, the second conductive layer 2042 is disposed on a side of the first conductive layer 2041 away from the substrate 200. The first conductive layer 2041 is a copper layer with a thickness of 3000 angstroms to 6000 angstroms, and the second conductive layer 2042 is a MoTiNi alloy layer with a thickness of 300 angstroms to 500 angstroms, and the third conductive layer 2043 is a MoTiNi alloy layer with a thickness of 300 angstroms to 500 Angstroms.

Figure 3C:
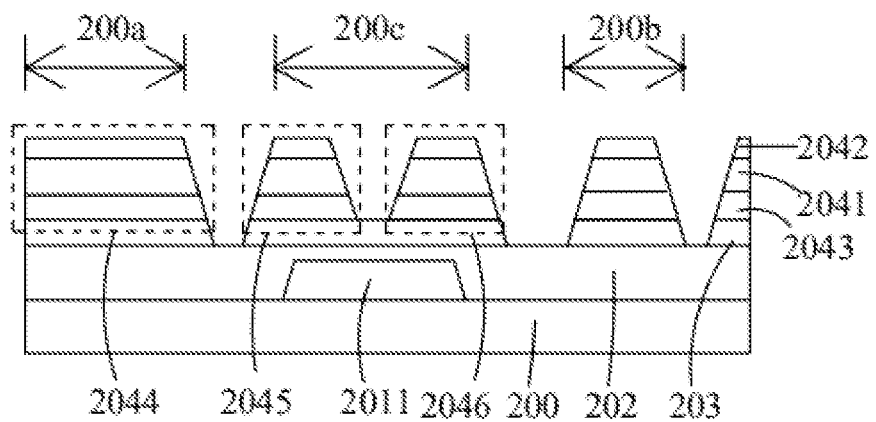

A photoresist layer is formed on a surface of the second metal layer away from the substrate 200. After the photoresist layer is exposed through a first halftone mask and developed with a developer, a fully remained photoresist layer is formed in the first area 200a and the second area 200b, and a fully remained photoresist layer is formed in the third area 200c at a place where source/drain electrodes are to be formed. The photoresist layer between the first area 200a and the third area 200c is completely removed, and the photoresist layer between the second area 200b and the third area 200c is completely removed. A partially remaining photoresist layer is formed in an area of the third area 200c at a place where a source is to be formed and in an area of the third area 200c at a place where a drain is to be formed. A wet etching is performed to etch the second metal layer between the first area 200a and the third area 200c and between the second are 200b and the third area 200c, which are not covered by the photoresist layer. A dry etching is performed to etch the amorphous silicon layer 203 between the first area 200a and the third area 200c and between the second area 200b and the third area 200c. The partially remaining photoresist layer in the third area 200c is removed, and a wet etching is performed to etch the second metal layer exposed after removing the partially remaining photoresist layer. The remaining photoresist layer is removed and a bonding pin 2044 is formed in the first area 200a, and an active layer and source/drain electrodes (2045, 2046) are formed in the third area 200c. The semiconductor layer and the second metal layer are remained in the second area 200b, as shown in FIG. 3C.

Since the second metal layers in the first area 200a and the second area 200b are entirely retained, this step forms both the first conductive layer 2041 and the second conductive layer 2042 in the first area 200a and the second area 200b of the substrate 200, and a bonding pin 2044 used to electrically connect with a driving chip in the first area 200a.

Figure 3D:
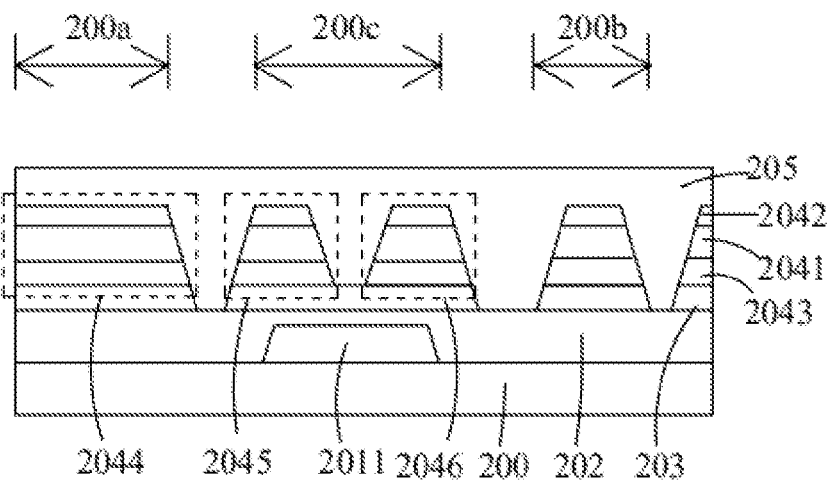

Step S204: forming a second insulating layer 205 covering the first insulating layer 202, the bonding pin 2044, the source/drain electrodes (2045, 2046), and the second conductive layer 2042 in the second area 200b, as shown in FIG. 3D.

Specifically, the second insulating layer 205 is formed by a chemical deposition. The second insulating layer 205 is a passivation layer. A material for forming the second insulating layer 205 may be a silicon nitride layer, a silicon oxide layer, or a stack of silicon nitride and silicon oxide layers. A thickness of the second insulating layer 205 ranges from 3000 angstroms to 6000 angstroms.

Figure 3E:
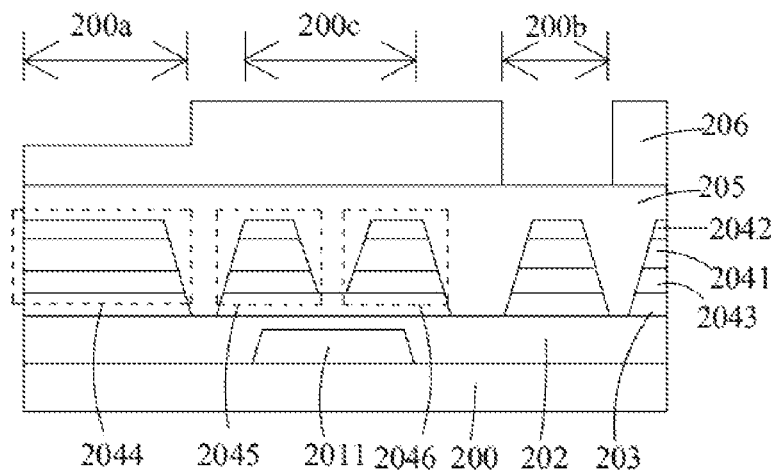

Step S205: forming a patterned photoresist layer 206 on the second insulating layer 205, as shown in FIG. 3E.

A photoresist layer with an entire surface is formed on the second insulating layer 205, and the photoresist layer is exposed using a second half-tone mask to define the first area 200a as a half-remained photoresist area and the second area 200b as a resist completely removed area, the area between the first area 200a and the second area 200b as a completely-remained photoresist area. The photoresist after exposure is treated with a developer, and the photoresist layer in the second area 200b is removed and the photoresist layer in the first area 200a is remained, and the photoresist layer in the area between the first area 200a and the second area 200b is completely remained. A thickness of the photoresist layer in the first area 200a is smaller than the thickness of the photoresist layer in the area between the first area 200a and the second area 200b.

Figure 3F:
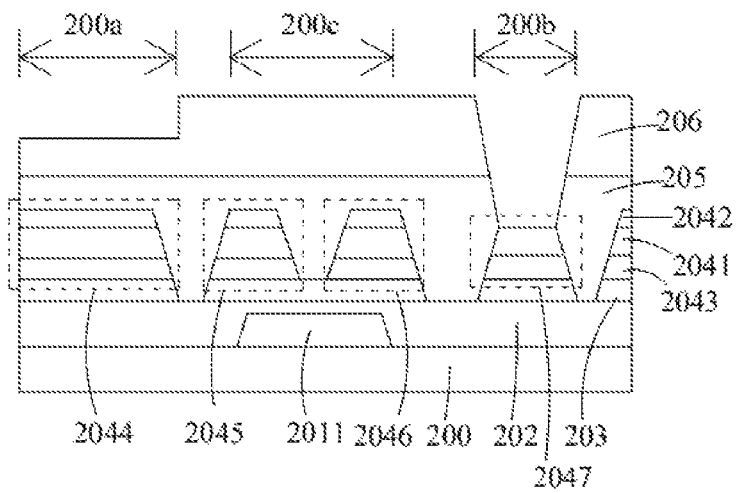

Step S206: etching the second insulating layer 205 in the second area 200b by a dry etching, and then removing the second conductive layer 2042 in the second area 200b is removed, thereby obtaining the electrode 2047 in the second area 200b to electrically connect with the LED through a connecting member, as shown in FIG. 3F.

Specifically, since only the second insulating layer 205 in the second area 200b is exposed, the second insulating layer 205 in the areas other than the second area 200b are covered by the patterned photoresist layer 206, one of a mixture of $SF_6$ and $Cl_2$, a mixture of $NF_3$ and He, and a mixture of $NF_3$ and $Cl_2$ is used to etch the second insulating layer 205 in the second area 200b. The second conductive layer 2042 in the second area 200b is then etched by using a second etching gas comprising $BCl_3$, and the second etching gas may also comprise $Cl_2$ to promote an etching rate of BCl3 for etching the second conductive layer 2042. The second conductive layer 2042 in the second area 200b is removed and the first conductive layer 2041 in the second area 200b and the third conductive layer 2043 is remained, and the first conductive layer 2041 and the third conductive layer 2043 in the second area 200b form a conductive electrode 2047.

Figure 3G:
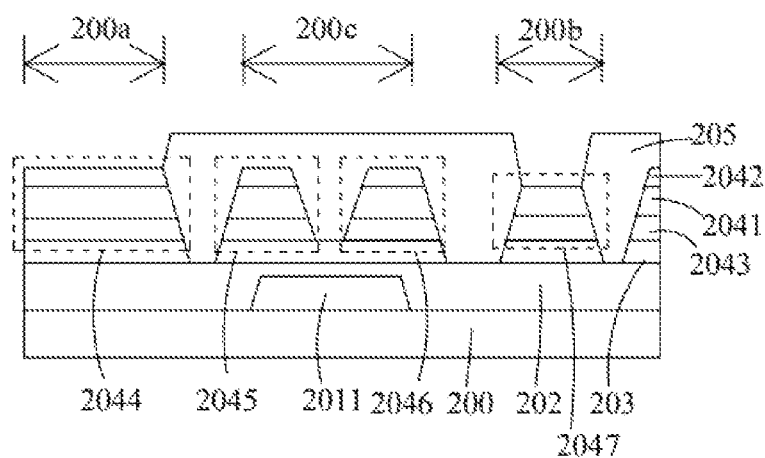

Step S207: removing the patterned photoresist layer 206 in the first area 200a disposed on the second insulating layer 205, and etching the second insulating layer 205 in the first area 200a with the first etching gas to expose the bonding pin 2044, and removing the remaining patterned photoresist layer 206, as shown in FIG. 3G.

An etching rate of the first etching gas for etching the second insulating layer 205 is greater than an etching rate of the first etching gas for etching the first conductive layer 2041. The first etching gas is a mixture of $NF_3$ and He, and it does not react with the copper layer while the mixture of $NF_3$ and He etches the second insulating layer 205 in the first area 200a, and this protects the conductive electrode 2047 comprising the copper layer.

Figure 3H:
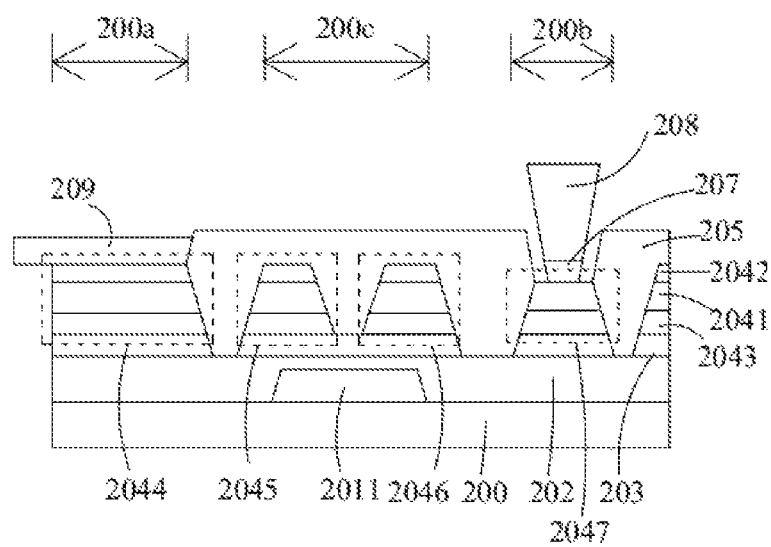

Step S208: using a solder paste 207 to fix a light-emitting element (LED) 208 on the conductive electrode 2047, and using an anisotropic conductive adhesive to bond the flip chip 209 to the bonding pin 2044, as shown in FIG. 3H.

The LED 208 is a mini LED. The flip chip 209 comprises a flexible film and a driving chip disposed on the flexible film, and the driving chip is used to output a driving signal.

The present application further provides an array substrate, comprising:

a substrate comprising a first area, a second area, and a third area, wherein the first area and the second area are spaced apart, and the third area is disposed between the first area and the second area;

a bonding pin in the first area of the substrate to electrically connect with a driving chip, wherein the binding pin comprises a first conductive layer and a second conductive layer, and the second conductive layer is located at a side of the first conductive layer away from the substrate;

a conductive electrode in the second area used to electrically connect with a light-emitting element (LED) by a connection member; and a thin film transistor disposed in the third area for driving the LED to emit light.

wherein adhesion between the first conductive layer and the connection member is greater than adhesion between the second conductive layer and the connection member, and the second conductive layer is used to prevent oxidation of the first conductive layer.

In some embodiments, a material for forming the first conductive layer is selected from Cu or a Cu alloy, and a material for forming the second conductive layer is selected from Mo or a Mo alloy, and a material for forming the connection member is selected from tin or a tin alloy. Specially, a material for forming the second conductive layer is MoTiNi alloy or MoNbTa alloy.

In some embodiments, the third area is further provided with a light-shielding layer, which is provided corresponding to the thin-film transistor to play a role in shielding the thin-film transistor. The light-shielding layer may be white ink or black photoresist layer.

When the bonding pin and the conductive electrode obtained by patterning two different conductive layers of the conventional technology are compared with the bonding pin and the conductive electrode of the present application obtained by patterning the stacked first conductive layer and second conductive layer, the fabrication method further simplifies the manufacturing process, and the second conductive layer of the bonding pin plays a role of preventing oxidation of the first conductive layer and improves oxidation resistances of the bonding pin. The first conductive layer of the conductive electrode and the connecting member have good adhesion and adhesion between the connector and the conductive electrode is improved, thereby firmly fixing the light emitting element on the array substrate.

The present application also provides a display device. The display device comprises a backlight module, and the backlight module comprises the above-mentioned array substrate, or the display device comprises a display panel, and the display panel comprises the above-mentioned array substrate.

Embodiments of the present application have been described in detail above, and specific examples have been used to explain the principles and implementations of the present application. The descriptions of the above embodiments are only used to help understand the technology of the present application, solutions and their core ideas; those of ordinary skill in the art should understand that they can still modify the technical solutions described in the foregoing embodiments or equivalently replace some of the technical features, and these modifications or replacements do not make the essence of the corresponding technical solutions deviate from the scope of the technical solutions of the embodiments of the present application.

What is claimed is:

1. A fabrication method of an array substrate, comprising following steps:

forming a first conductive layer and a second conductive layer on both of a first area and a second area of a substrate and a bonding pin in the first area to electrically connect with a driving chip, wherein the second conductive layer is located at a side of the first conductive layer away from the substrate, and the first area and the second area are spaced apart;

forming an insulating layer covering the second conductive layer of the first area and the second area;

removing the insulating layer and the second conductive layer in the second area, forming a conductive electrode in the second area to electrically connect with a light-emitting element by a connection member; and using a first etching gas to etch the insulating layer in the first area, exposing the bonding pin, wherein the first etching gas etches the insulating layer at a rate faster than a rate of the first etching gas etching the first conductive layer;

wherein adhesion between the first conductive layer and the connection member is greater than adhesion between the second conductive layer and the connection member, and the second conductive layer is used to prevent oxidation of the first conductive layer.

2. The fabrication method according to claim 1, wherein the first etching gas comprises $NF_3$.

3. The fabrication method according to claim 2, wherein the first etching gas further comprises an inert gas.

4. The fabrication method according to claim 1, wherein the first etching gas is a mixture of $NF_3$ and He.

5. The fabrication method according to claim 1, wherein a material for forming the first conductive layer is selected from Cu or a Cu alloy, and a material for forming the second conductive layer is selected from Mo or a Mo alloy, and a material for forming the connection member is selected from tin or a tin alloy.

6. The fabrication method according to claim 1, wherein a material for forming the second conductive layer is a MoTiNi alloy.

7. The fabrication method according to claim 1, wherein removing the second conductive layer in the second area comprises:

etching the second conductive layer in the second area by using a second etching gas comprising $BCl_3$.

8. The fabrication method according to claim 7, wherein the second etching gas further comprises $Cl_2$.

* * * * *